(12) United States Patent
Tsai

(10) Patent No.: US 7,569,460 B2
(45) Date of Patent: Aug. 4, 2009

(54) CAPACITOR STRUCTURE AND METHOD FOR PREPARING THE SAME

(75) Inventor: Sheng Da Tsai, Jinshan (TW)

(73) Assignee: Promos Technologies Inc., Hsinchu (TW)

( * ) Notice: Subject to any disclaimer, the term of this patent is extended or adjusted under 35 U.S.C. 154(b) by 221 days.

(21) Appl. No.: 11/583,805

(22) Filed: Oct. 20, 2006

(65) Prior Publication Data

US 2008/0048235 A1 Feb. 28, 2008

(30) Foreign Application Priority Data

Aug. 25, 2006 (TW) .............................. 95131277 A

(51) Int. Cl.
*H01L 21/20* (2006.01)
(52) U.S. Cl. ................. 438/396; 438/253; 257/E21.001
(58) Field of Classification Search .................. 438/253, 438/396

See application file for complete search history.

(56) References Cited

U.S. PATENT DOCUMENTS

| 5,895,250 | A | 4/1999 | Wu | |
|---|---|---|---|---|
| 6,599,794 | B2 * | 7/2003 | Kiyotoshi et al. | ........... 438/240 |

* cited by examiner

*Primary Examiner*—Jack Chen
(74) *Attorney, Agent, or Firm*—Oliff & Berridge, PLC

(57) ABSTRACT

A capacitor structure comprises a substrate having a contact plug, a conductive cylinder positioned on the substrate and an electroplating structure covering the conductive cylinder, wherein a bottom electrode of the capacitor structure comprises the conductive cylinder and the electroplating structure. The conductive cylinder can be a hollow conductive cylinder, and the electroplating structure comprises a first conductive layer covering the inner sidewall and bottom surface of the hollow conductive cylinder and a second conductive layer covering the first conductive layer and the outer sidewall of the hollow conductive cylinder. The conductive cylinder and the electroplating structure can be made of different conductive material, and the free end of the conductive cylinder is preferably round. The conductive cylinder can be made of titanium nitride or tantalum nitride, while the electroplating structure can be made of ruthenium or platinum.

8 Claims, 8 Drawing Sheets

CAPACITOR STRUCTURE AND METHOD FOR PREPARING THE SAME

BACKGROUND OF THE INVENTION (A) Field of the Invention

The present invention relates to a capacitor structure of a semiconductor memory and method for preparing the same, and more particularly, to a capacitor structure having a multi-layered bottom electrode and method for preparing the same using deposition and electrochemical plating techniques.

(B) Description of the Related Art

A DRAM memory cell generally consists of a metal oxide semiconductor field effect transistor (MOSFET) and a capacitor, and the transistor includes a source electrode electrically connected to a bottom electrode of the capacitor. There are two types of capacitors: stacked capacitors and deep trench capacitors. The stacked capacitor is fabricated on the surface of a silicon substrate, while the deep trench capacitor is fabricated inside the silicon substrate.

FIG. 1 and FIG. 2 illustrate a method for preparing a stacked capacitor 22 according to the prior art. The method forms a semicrown-shaped bottom electrode 20', and a dielectric layer 24 is then formed on the semicrown-shaped bottom electrode 20', which is hollow. Subsequently, an upper electrode 26 is formed on the dielectric layer 24 to complete the stacked capacitor 22. The integrity of the dynamic random access memory increases rapidly with continuous improvements in the semiconductor fabrication process, but the lateral width of the capacitor must be decreased to achieve high integrity. However, decreasing the lateral width results in reduced size of the surface area, i.e., a reduced capacitance, which is proportional to the surface area.

To maintain or increase the capacitance of the capacitor, researchers increase the vertical height and decrease the lateral width of the capacitor to increase the size of the surface area of the capacitor, i.e., increase the aspect ratio of the capacitor to compensate for the decreased lateral width of the capacitor and achieve high integrity. However, achieving the objective of high integrity by increasing the aspect ratio of the capacitor creates an arduous problem, i.e., the hollow semicrown-shaped bottom electrode 20', referring to FIG. 1, is likely to lean or even collapse due to insufficient mechanical supporting strength during the subsequent fabrication process.

SUMMARY OF THE INVENTION

One aspect of the present invention provides a capacitor structure of a semiconductor memory and a method for preparing the same, which uses the deposition technique and the electroplating technique to prepare a multi-layered bottom electrode to increase the mechanical supporting strength to prevent the capacitor structure from leaning or even collapsing during the subsequent fabrication process.

A capacitor structure of a semiconductor memory according to this aspect of the present invention comprises a substrate having a contact plug, a conductive pillar positioned on the contact plug and an electroplating structure positioned on the surface of the conductive pillar, wherein a bottom electrode of the capacitor structure includes the conductive pillar and the electroplating structure. The conductive pillar can be a hollow cylinder, and the electroplating structure may include a first conductive layer positioned on an inner surface of the hollow cylinder and a second conductive layer covering the first conductive layer and an outer surface of the hollow cylinder. The conductive pillar and the electroplating structure are made of different material, and preferably the conductive pillar includes titanium nitride or tantalum nitride and the electroplating structure includes ruthenium or platinum. The capacitor structure of a semiconductor memory may further comprise a dielectric layer positioned on the surface of the electroplating structure and a conductive layer positioned on the surface of the dielectric layer. In particular, a bottom electrode of the capacitor structure includes the conductive pillar and the electroplating structure.

Another aspect of the present invention provides a method for preparing a capacitor structure of a semiconductor memory, comprising the steps of forming a stacked structure on a substrate having a contact plug, forming an opening in the stacked structure and the opening exposing the contact plug, forming a conductive pillar in the opening and the conductive pillar electrically connecting the contact plug, performing at least one electrochemical plating process to form an electroplating structure on the surface of the conductive pillar, forming a dielectric layer covering the surface of the electroplating structure, and forming a conductive layer covering the surface of the dielectric layer.

The electroplating structure can be formed on the surface of the conductive pillar by performing a first electrochemical plating process to form a first conductive layer on an inner surface of the conductive pillar, removing a portion of the stacked structure and performing a second electrochemical plating process to form a second conductive layer covering an outer surface of the conductive pillar. The stacked structure includes a silicon nitride layer positioned on the substrate and a silicon oxide layer positioned on the silicon nitride layer, and the step of removing a portion of the stacked structure removes the silicon oxide layer.

The conventional hollow semicrown-shaped bottom electrode is likely to lean or even collapse due to insufficient mechanical supporting strength during the fabrication process. In contrast, the bottom electrode of the capacitor structure of the present invention includes the conductive pillar and the electroplating structure encapsulating the conductive pillar, and the electroplating structure can provide sufficient mechanical supporting strength to prevent the capacitor structure from leaning or collapsing during the subsequent fabrication process.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

Figure 1:
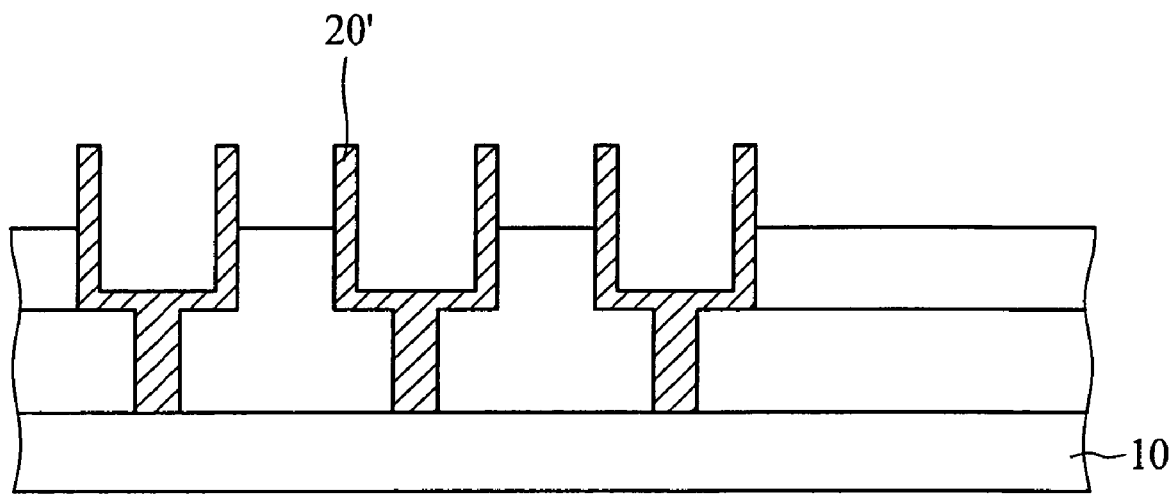
FIG. 1 and FIG. 2 illustrate a method for preparing a stacked capacitor according to the prior art.
Figure 2:
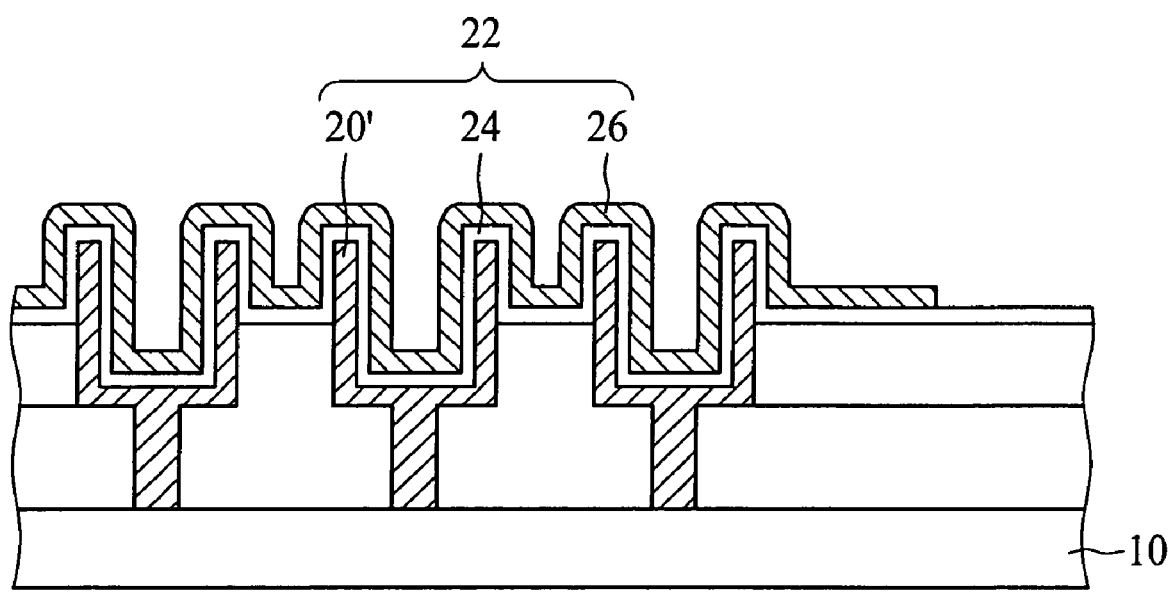
Figure 3:
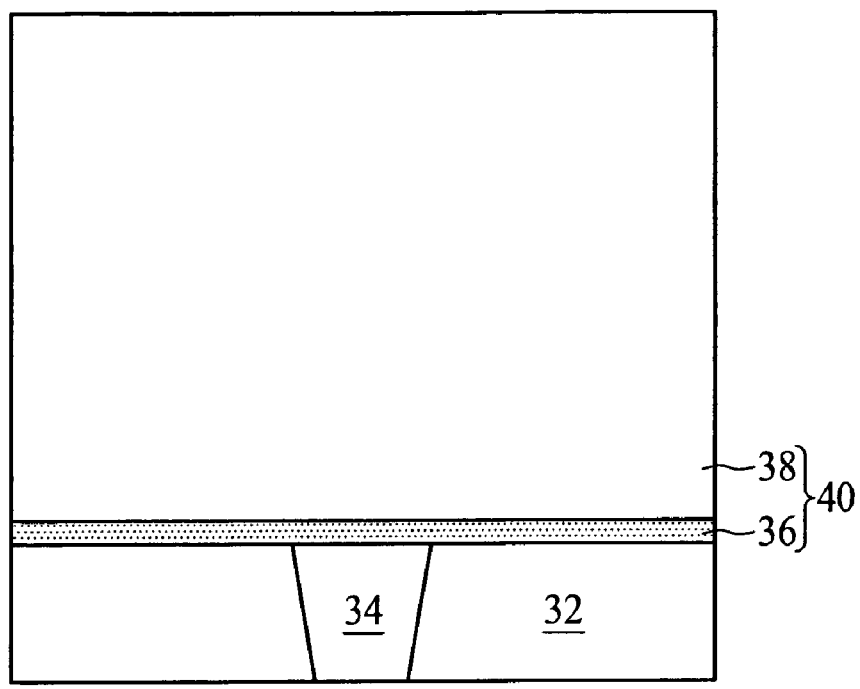
FIG. 3 to FIG. 10 illustrate a method for preparing a capacitor structure according to a first embodiment of the present invention.
Figure 4:
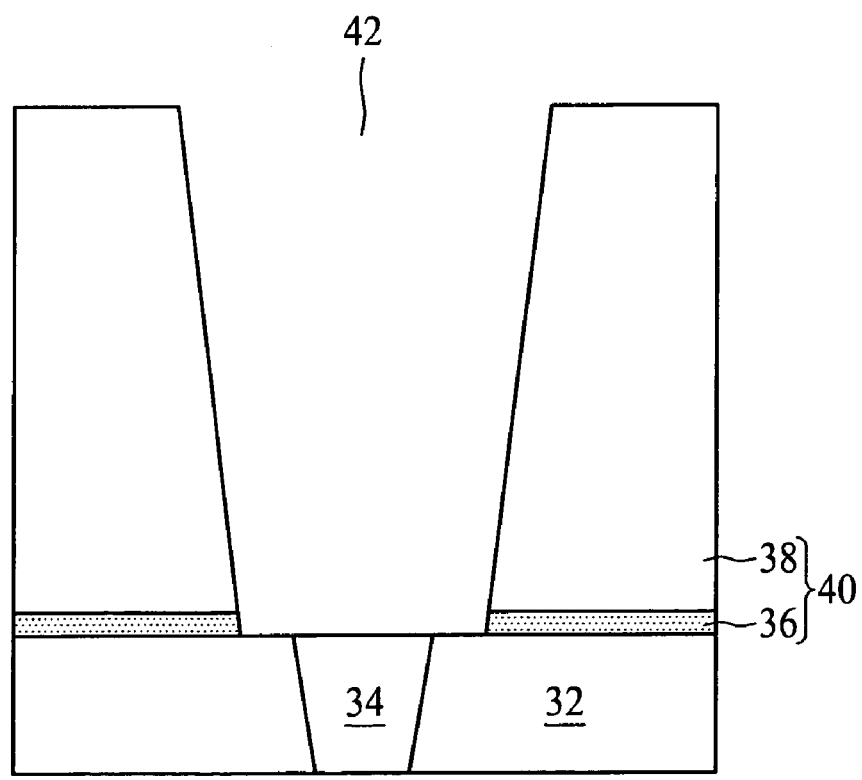

FIG. 3 to FIG. 10 illustrate a method for preparing a capacitor structure 70 according to a first embodiment of the present invention. Deposition processes are performed to form a stacked structure 40 on a substrate 32 having a contact plug 34. Preferably, the stacked structure 40 includes a silicon nitride layer 36 positioned on the substrate 32 and a silicon oxide layer 38 positioned on the silicon nitride layer 36. Subsequently, lithographic and etching processes are performed to form an opening 42 in the stacked structure 40, and the opening 42 exposes the contact plug 34, as shown in FIG. 4.

Figure 5:
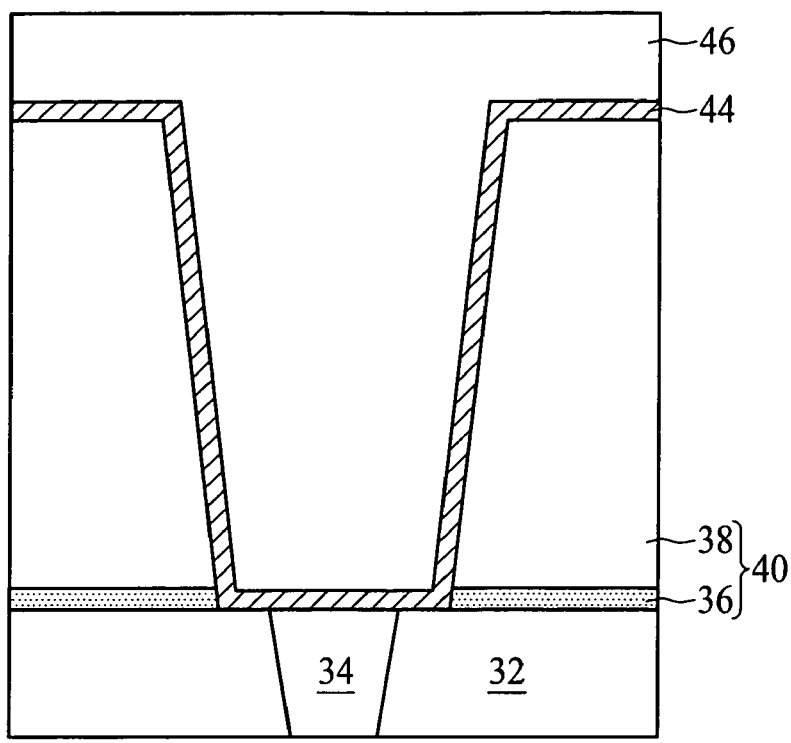
Figure 6:
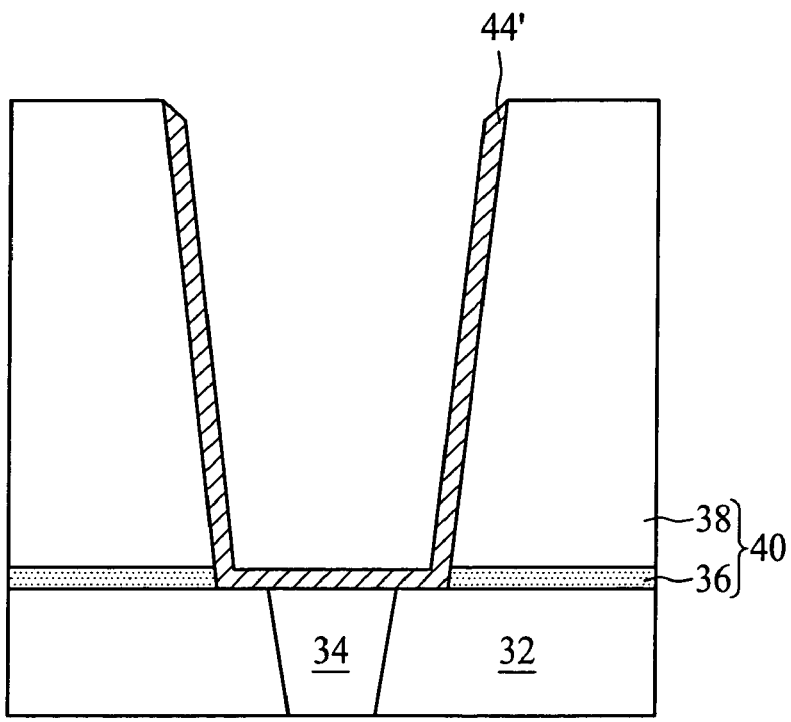

Referring to FIG. 5, a deposition process such as atomic layer deposition is performed to form a conductive layer 44 on the surface of the stacked structure 40 and on an inner sidewall of the opening 42, and a spin-coating process is performed to form a sacrificial layer 46 on the surface of the conductive layer 44. The sacrificial layer 46 can be made of photoresist material or dielectric material, and the conductive layer 44 may include titanium nitride or tantalum nitride. Subsequently, an etch back process is performed to remove the sacrificial layer 46 and remove a portion of the conductive layer 44 from the surface of the stacked structure 40 to form a conductive pillar, i.e., a hollow cylinder 44' in the opening 42. The bottom of the conductive hollow cylinder 44' electrically connects to the contact plug 34, as shown in FIG. 6.

Figure 7:
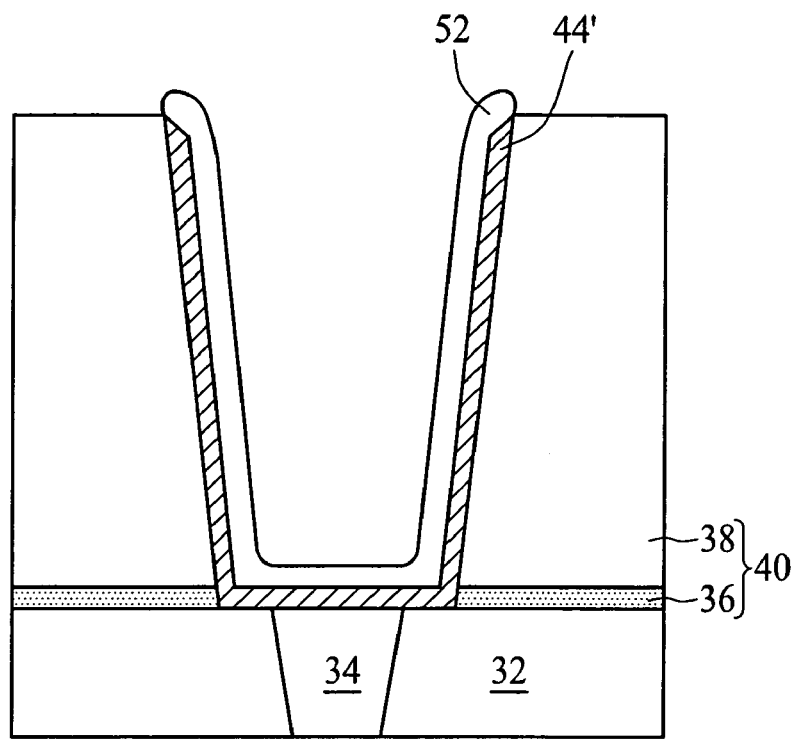
Figure 8:
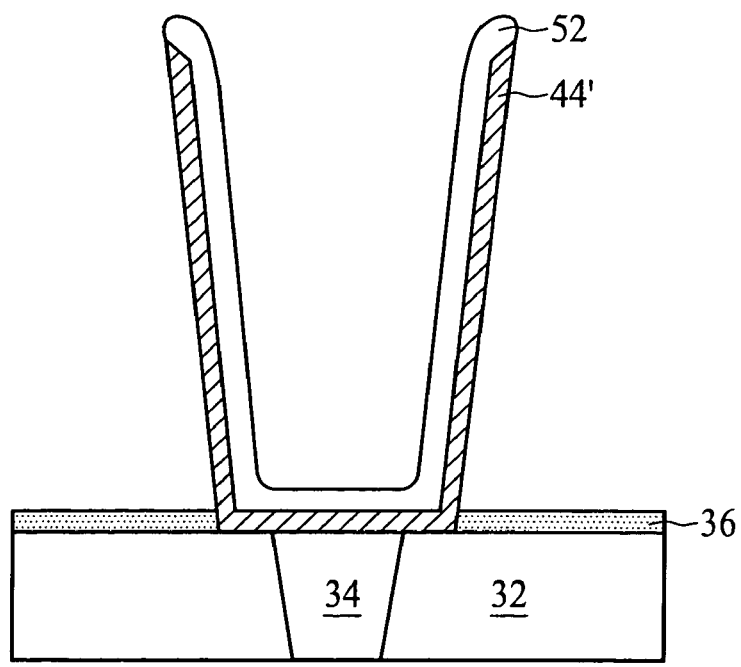

Referring to FIG. 7, a first electrochemical plating process is performed to form a first conductive layer 52 on an inner surface of the conductive hollow cylinder 44', and the first conductive layer 52 may include ruthenium or platinum. Subsequently, a wet etching process is performed using buffered oxide etchant to remove a predetermined portion of the stacked structure 40, for example, remove the silicon oxide layer 38 from the silicon nitride layer 36, as shown in FIG. 8. In particular, the first conductive layer 52 can provide mechanical support to the conductive hollow cylinder 44' to prevent the conductive hollow cylinder 44' from leaning or collapsing during the wet etching process and the subsequent fabrication process.

Figure 9:
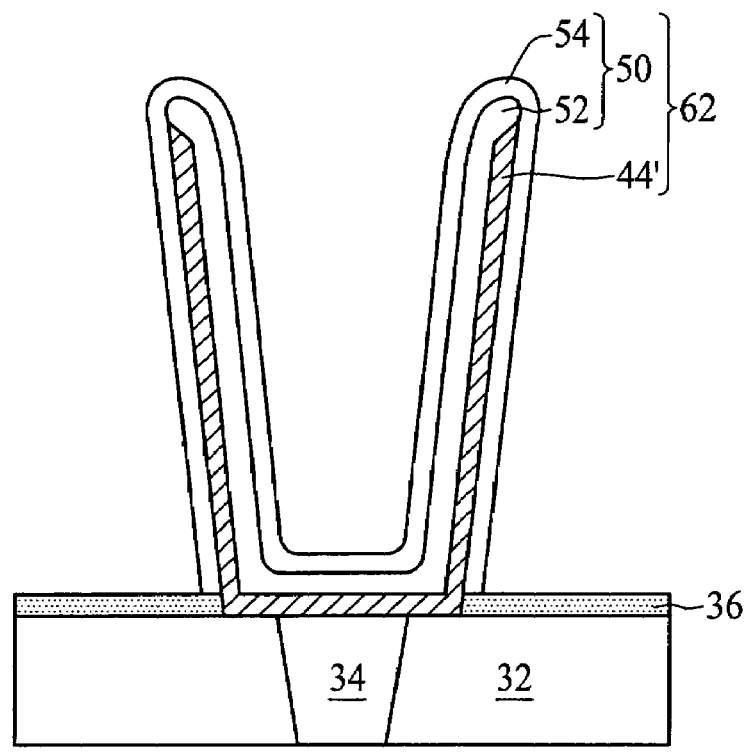
Figure 10:
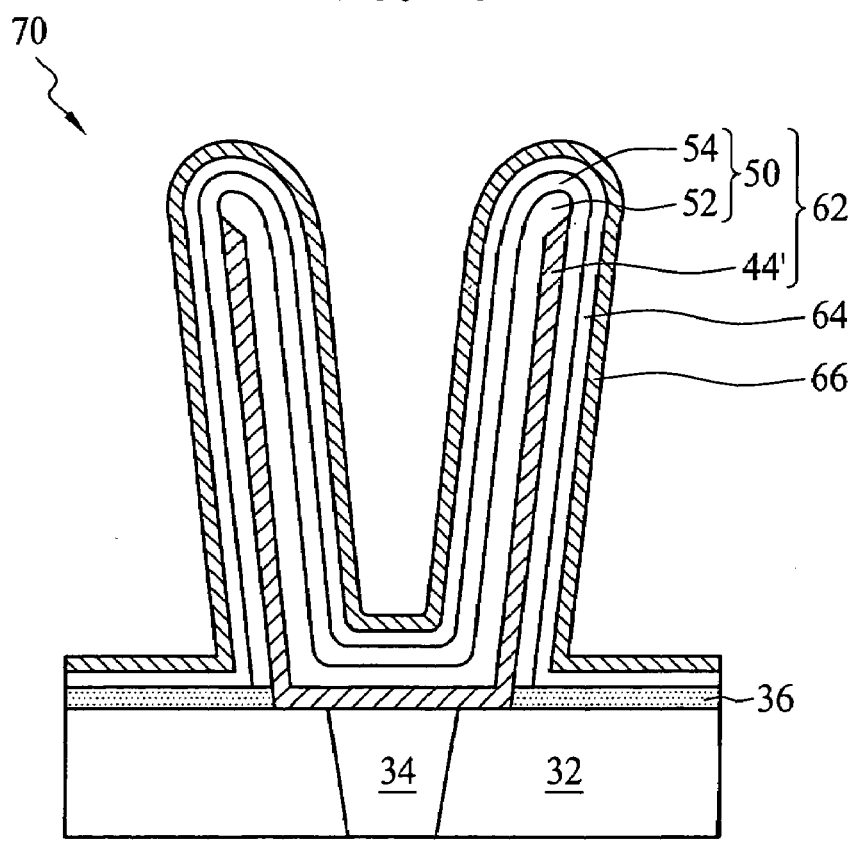
Figure 11:
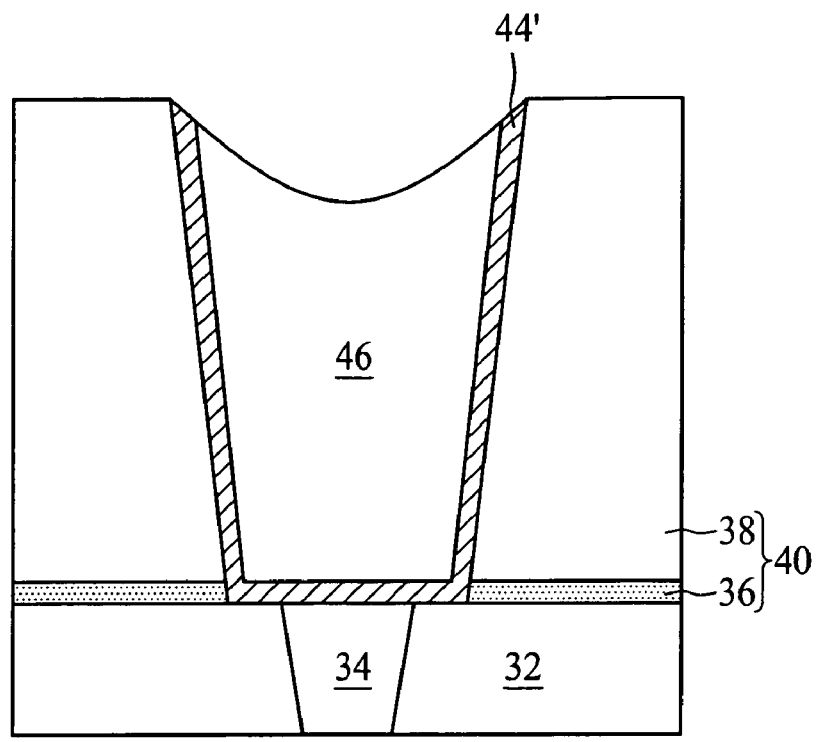
FIG. 11 to FIG. 16 illustrate a method for preparing a capacitor structure according to a second embodiment of the present invention.

Referring to FIG. 9, a second electrochemical plating process is performed to form a second conductive layer 54 covering an outer surface of the conductive hollow cylinder 44' and the first conductive layer 52. The second conductive layer 54 may include ruthenium or platinum, and the first conductive layer 52 and the second conductive layer 54 form an electroplating structure 50 covering the conductive hollow cylinder 44'. In particular, the second conductive layer 54 can provide mechanical support to the conductive hollow cylinder 44' as well. Subsequently, a dielectric layer 64 is formed to cover the surface of the electroplating structure 50 and a conductive layer 66 is then formed to cover the surface of the dielectric layer 64 to complete the capacitor structure 70, as shown in FIG. 10. The electroplating structure 50 and the conductive hollow cylinder 44' form a bottom electrode of the capacitor structure 70, i.e., the capacitor structure 70 possesses a sandwich structure consisting of a metal (bottom electrode 62), a dielectric material (dielectric layer 64), and a metal (conductive layer 66).

Figure 12:
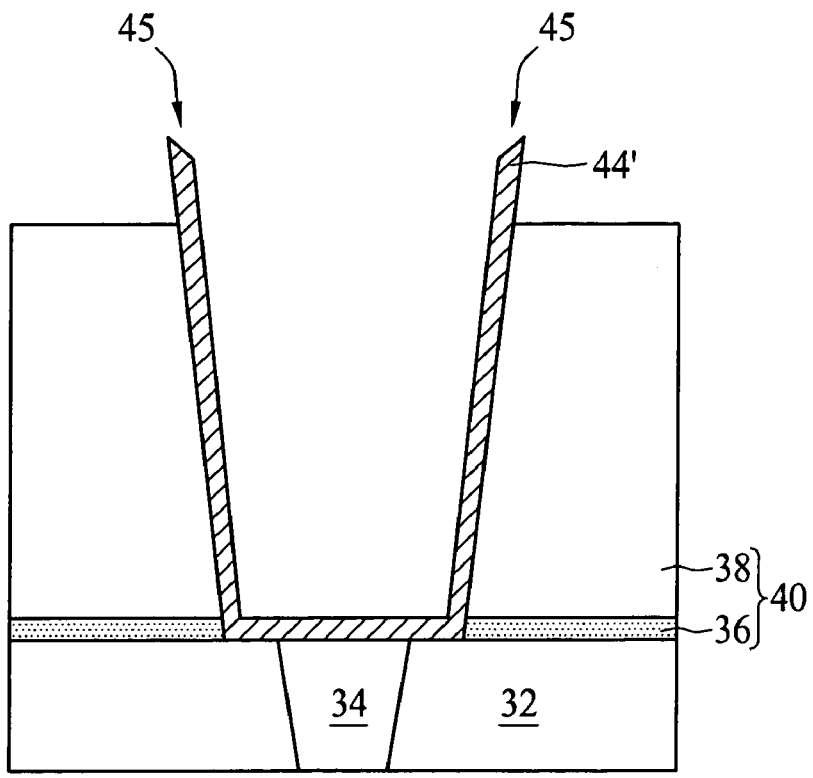

FIG. 11 to FIG. 16 illustrate a method for preparing a capacitor structure 80 according to a second embodiment of the present invention. The fabrication processes shown in FIG. 3 to FIG. 5 are performed first, and an etch back process to remove a portion of the sacrificial layer 46 and a portion of the conductive layer 44 on the surface of the stacked structure 40 to form a conductive hollow cylinder 44' in the opening 42. Subsequently, a wet etching process using buffered oxide etchant is performed to remove the sacrificial layer 46 remaining in the conductive hollow cylinder 44', and remove a portion of the silicon oxide layer 38 to expose the free end 45 of the conductive hollow cylinder 44', as shown in FIG. 12.

Figure 13:
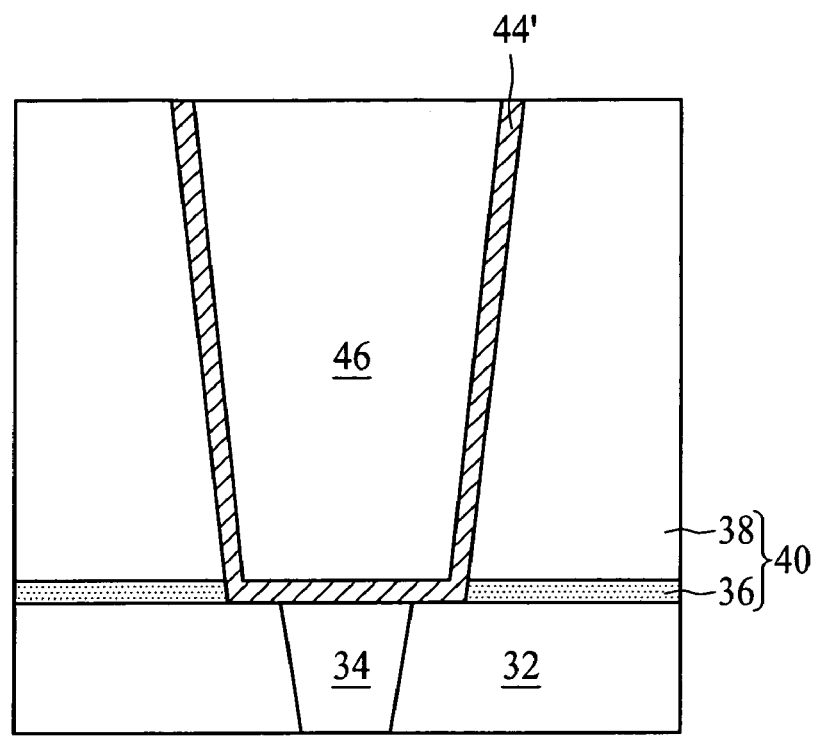
Figure 14:
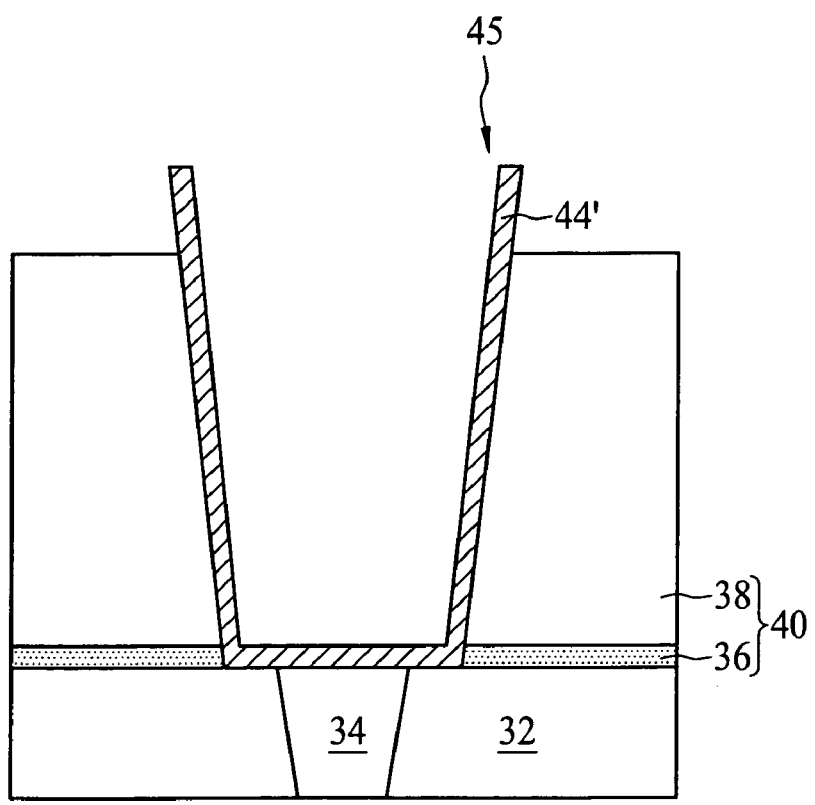

In particular, a chemical-mechanical polishing process may be performed in place of the etch back process, performed after the fabrication processes shown in FIG. 3 to FIG. 5, to remove a portion of the sacrificial layer 46 and a portion of the conductive layer 44 on the surface of the stacked structure 40 to form a conductive hollow cylinder 44' in the opening 42, as shown in FIG. 13. Subsequently, a wet etching process using buffered oxide etchant is performed to remove the sacrificial layer 46 remaining in the conductive hollow cylinder 44', and remove a portion of the silicon oxide layer 38 to expose the free end 45 of the conductive hollow cylinder 44', as shown in FIG. 14.

Figure 15:
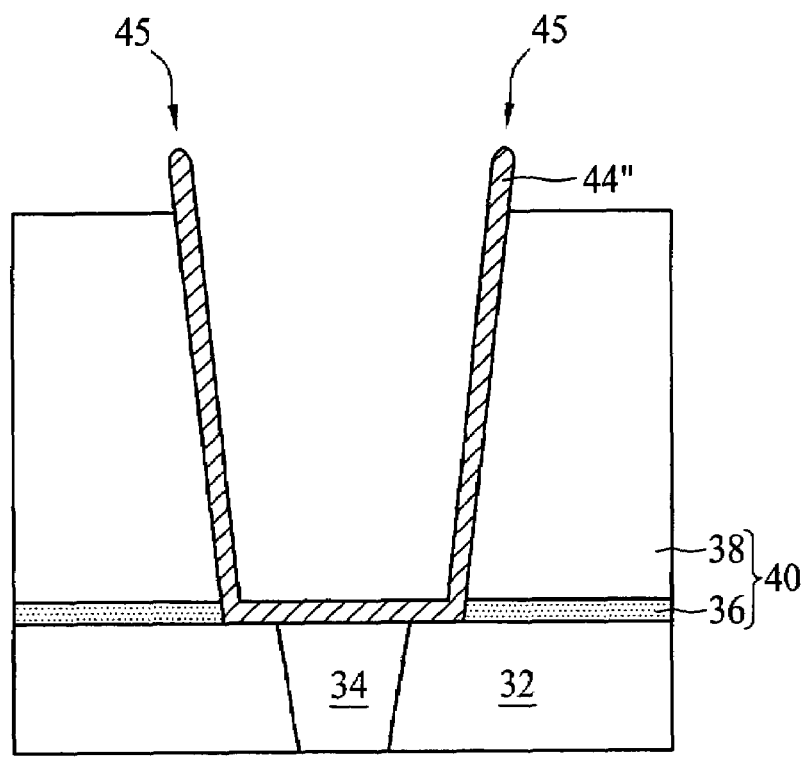
Figure 16:
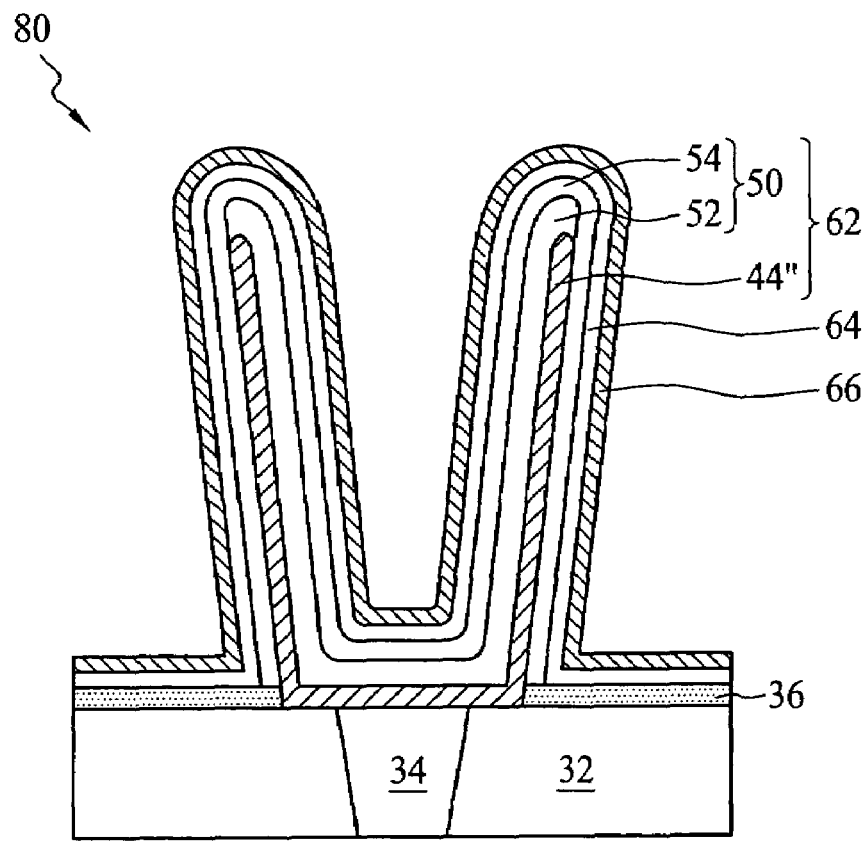

Referring to FIG. 15, a cleaning process is performed using SC1 solution, a mixture of ammonia and hydrogen peroxide, to round the free end 45 to form a conductive hollow cylinder 44" having a round free end 45', and the fabrication processes shown in FIG. 7 to FIG. 10 are then performed to complete the capacitor structure 80, as shown in FIG. 16. Since the point-shaped free end 45 is likely to generate leakage current due to the point discharge effect, the present invention rounds the free end 45 to form a round free end 45' by placing the free end 45 in the SC1 solution to prevent the generation of the leakage current.

The conventional hollow semicrown-shaped bottom electrode 20' is likely to lean or even collapse due to insufficient mechanical supporting strength during the fabrication process. In contrast, the electroplating structure 50 consisting of the first conductive layer 52 and the second conductive layer 54 can provide sufficient mechanical supporting strength to prevent the conductive hollow cylinder 44' and 44" of the capacitor structure 70 and 80 from leaning or collapsing during the subsequent fabrication process.

The above-described embodiments of the present invention are intended to be illustrative only. Numerous alternative embodiments may be devised by those skilled in the art without departing from the scope of the following claims.

What is claimed is:

1. A method for preparing a capacitor structure of a semiconductor memory, comprising the steps of:
   forming a stacked structure on a substrate having a contact plug;
   forming an opening in the stacked structure, the opening exposing the contact plug;
   forming a conductive pillar in the opening, the conductive pillar electrically connecting the contact plug; and
   performing at least one electrochemical plating process to form an electroplating structure on a surface of the conductive pillar;
   wherein the step of performing at least one electrochemical plating process includes:
      performing a first electrochemical plating process to form a first conductive layer on an inner surface of the conductive pillar; and
      performing a second electrochemical plating process to form a second conductive layer covering an outer surface of the conductive pillar.

2. The method for preparing a capacitor structure of a semiconductor memory of claim 1, further comprising a step of removing a portion of the stacked structure before performing a second electrochemical plating process.

3. The method for preparing a capacitor structure of a semiconductor memory of claim 2, wherein the stacked structure includes a silicon nitride layer positioned on the substrate and a silicon oxide layer positioned on the silicon nitride layer, and the step of removing a portion of the stacked structure removes the silicon oxide layer.

4. The method for preparing a capacitor structure of a semiconductor memory of claim 1, further comprising a step of rounding a free end of the conductive pillar.

5. The method for preparing a capacitor structure of a semiconductor memory of claim 1, wherein the step of forming a conductive pillar in the opening includes:

forming a conductive layer on a surface of the stacked structure and an inner sidewall of the opening; and removing a portion of the conductive layer from the surface of the stacked structure.

6. The method for preparing a capacitor structure of a semiconductor memory of claim 5, wherein the conductive layer is formed by atomic layer deposition process.

7. The method for preparing a capacitor structure of a semiconductor memory of claim 5, wherein removing a portion of the conductive layer from the surface of the stacked structure is performed by an etch back process or a chemical-mechanical polishing process.

8. The method for preparing a capacitor structure of a semiconductor memory of claim 1, further comprising the steps of:

forming a dielectric layer covering a surface of the electroplating structure; and forming a conductive layer covering a surface of the dielectric layer.

* * * * *